United States Patent [19]
Datta et al.

[11] Patent Number: 5,462,638
[45] Date of Patent: Oct. 31, 1995

[54] SELECTIVE ETCHING OF TIW FOR C4 FABRICATION

[75] Inventors: Madhav Datta, Yorktown Heights; Ravindra V. Shenoy, Peekskill, both of N.Y.

[73] Assignee: International Business Machines Corporation, Armonk, N.Y.

[21] Appl. No.: 260,049

[22] Filed: Jun. 15, 1994

[51] Int. Cl.$^6$ ............................ H01L 21/00; B44C 1/22; C23F 1/02
[52] U.S. Cl. ..................... 156/656.1; 156/659.11; 752/79.4; 437/192; 437/228; 437/245
[58] Field of Search ............... 252/79.2, 79.4; 156/656, 659.1, 664; 437/192, 228, 245, 246

[56] References Cited

U.S. PATENT DOCUMENTS

| | | | |
|---|---|---|---|
| 4,554,050 | 11/1985 | Minford et al. | 156/664 |
| 4,671,852 | 6/1987 | Pyke | 156/652 |
| 4,814,293 | 3/1989 | Van Oekel | 437/192 |
| 5,041,191 | 8/1991 | Watson | 156/652 |
| 5,130,275 | 7/1992 | Dion | 437/225 |

*Primary Examiner*—William Powell
*Attorney, Agent, or Firm*—Ratner & Prestia

[57] ABSTRACT

A chemical etchant (and a method for forming the etchant) is disclosed for removing thin films of titanium-tungsten alloy in microelectronic chip fabrication. The alloy removed is preferably 10% Ti and 90% W, which is layered onto a substrate under chromium and copper seed layers for electrodeposition of C4 solder bumps. In this application the Ti—W etchant should not attack aluminum, chromium, copper, or lead-tin solders, and should dissolve Ti—W rapidly. The invention achieves this with a mixture of 30% by weight hydrogen peroxide and water, to which is added EDTA and potassium sulfate. The hydrogen peroxide etches Ti—W rapidly at temperatures between 40° C. and 60° C. EDTA forms a complex with tungsten to prevent plating of the Pb—Sn solder with W, and potassium sulfate forms a protective coating on the Pb—Sn solder to protect it from chemical attack.

19 Claims, 2 Drawing Sheets

SELECTIVE ETCHING OF TIW FOR C4 FABRICATION

BACKGROUND OF THE INVENTION

1. Field of the Invention

The present invention relates to etching of titanium or tungsten alloys, especially in microelectronics fabrication of N structures.

2. Description of the Related Art

C4 is an advanced microelectronic chip packaging and connection technology. "C4" stands for Controlled Collapse Chip Connection. C4 is also known as "solder bump" and "flip chip".

The basic idea of C4 is to connect chips, chip packages, or such other units by means of solder balls partially crushed between two surfaces of the units. These tiny balls of electrically conductive solder bridge the gaps between respective pairs of metal pads on the units being connected. Each pad has a corresponding pad on the other unit's surface; the pad arrangements are mirror images. As the units are pressed together the solder balls on the pads of the first unit are pressed against corresponding conductive pads (having no balls) on the second unit, partially collapsing the solder balls and making connections between respective pads.

In C4 the solder balls are formed directly on the metal pads of the one unit. The pads are electrically isolated from other components by the insulating substrate that surrounds each pad. The substrate might be un-doped silicon (Si) or some other material. The bottom of the pad is electrically connected into the chip circuit.

When the two surfaces are aligned and then pushed together, the soft solder bumps are partially crushed. This allows all the connections to be made in one step, in spite of slight variations in the surfaces.

A major application of C4 is in joining semiconductor microchips (integrated circuits) to chip packages. Chips usually are made in rectangular arrays on a mono-crystalline slab of silicon, called a "wafer," which is a thin disc several inches across. Many chips are formed on each wafer, and then the wafer is broken up into individual chips and the chips are "packaged" in units large enough to be handled. The C4 balls are placed on the chips while they are still joined in a wafer.

The wafers are made as large as possible so as to reduce the number wafers that must be processed to make a certain number of chips. For the same reason (among others) the chips are made as small as possible. Thus, the best C4 fabrication system is one that can make thousands of very small, closely-spaced solder balls each precisely placed over a large area.

C4 allows a very high density of electrical interconnections. Unlike earlier techniques which made connections around the perimeter of a chip or a chip package, C4 allows one or more surfaces of a chip or package to be packed with pads. The number of possible connections with C4 is roughly the square of the number that is possible with perimeter connection. Since the C4 balls can be made quite small, about a hundredth of an inch in diameter, the surface density of C4 connections can be on the order of thousands per square inch.

Electrical engineers are constantly placing more and more circuits onto each chip, to improve performance and reduce cost. As the number of circuits on a chip grows, so does the number of connections needed. C4, which allows more connections in a small space than any other technique, is commercially important.

Besides making possible area connection, C4 can also used with perimeter connection techniques such as tape automated bonding (TAB), in which solder balls on a chip are pressed against a pattern of metal foil adhered on a plastic substrate of the chip package. These applications, too, are commercially important.

C4 solder bumps must be mechanically well-fastened to their pads, or they may be torn off when the two surfaces are pushed together. It will be appreciated that a complex device such as a computer may have dozens of chips and hundreds or thousands of C4 solder ball connections, and the entire device may be rendered useless if only one of the balls fails. The attachment of the C4 balls requires careful design.

One method of forming solder bumps uses sputtering or vacuum deposition. Solder metal is evaporated in a vacuum chamber. The metal vapor coats everything in the chamber with a thin film of the evaporated metal. To form solder balls on the substrate, the vapor is allowed pass through holes in a metal mask held over the substrate. The solder vapor passing through the holes condenses onto the cool surface into rounded solder balls. This method requires a high vacuum chamber to hold the substrate, mask, and flash evaporator.

The mask is specially made with high-precision holes, or "vias," for locating the solder balls. The mask will be heated as hot metal vapor released into the vacuum chamber condenses on it. To avoid misalignment of the vias due to thermal expansion, the masks may be made of special metals, and even so the size of the mask is limited. Thus, this method cannot be used for large wafers containing many chips.

An alternative technique for making solder bumps is electrodeposition, also called electrochemical plating or electroplating. This method also uses a mask and forms solder bumps only at the selected sites, but the technique is very different from the evaporation method.

Solder bump electrodeposition requires a first preliminary step, the creation of a continuous "seed layer" of conductive metal adhered onto the insulating substrate. The seed layer is needed to conduct the electricity which deposits solder.

FIG. 1A, labelled "prior art," shows a wafer substrate S whose surface is overlaid with a conductive layer L1 of chromium (Cr). This metal layer, which will function as part of the seed layer for electrodepositing solder balls, might be a ten-thousandth of a millimeter thick. On top of the Cr is deposited a thin "phased" layer L2 of 50% chromium—50% copper (Cr—Cu). Finally, a third layer L3 of pure copper is deposited over all. The Cr, Cr—Cu, and Cu layers are of comparable thicknesses. (FIG. 1A shows atop the seed layers L1–L3 a solder bump B and mask M, which are added in later steps. The first step of coating the substrate S is done on a bare substrate surface.)

The second preliminary step, after the seed layer is laid down, is to form a mask by photolithography. A layer of photoresist is laid onto the seed layer and exposed to light. Un-exposed photoresist can then be washed away to leave the cured photoresist behind as a mask. Cured photoresist is shown in FIG. 1A as part of the mask M.

When the exposed photoresist has been cured and the uncured photoresist has been removed, the mask is complete. The mask has rows of holes where the solder bumps are to be deposited.

The third step is electrodeposition (electroplating) of lead alloy into the mask holes. An electrodeposited solder bump B is shown in FIG. 1A. The solder bump B might be ¼ millimeter thick; the thickness of the seed layers L1–L3 is exaggerated in FIG. 1A for clarity.

A solder bump B contains a small amount of tin (Sn) and so will adhere well to the uppermost copper layer. The two metals react to form an "intermetallic," $Cu_xSn_y$, (for example, $Cu_3Sn$). The phased Cr—Cu layer L2 holds the Cr and Cu layers together, and the Cr sticks well to the wafer.

After the solder bumps are formed, the mask of cured photoresist is removed. The substrate now is covered with the continuous seed layer and numerous solder bumps.

After the seed layer is deposited over the substrate and the C4 bumps have been formed, the seed layer is desirably removed in between the solder bumps to electrically isolate them. The removal can be done by chemical etching or by electroetching.

FIG. 1B shows the seed layers removed to leave the solder bumps electrically isolated but mechanically fixed to the substrate. This is accomplished by etching the layers L1–L3 away with chemical or electrolytic action; in either case the solder bump B protects the layers under it. FIG. 1C shows a solder ball B formed by melting, or reflowing, the solder bump B of FIGS. 1A–1B. The solder ball is now ready to make contact.

Alloys of titanium (Ti) tungsten (W; also called wolfram) have been used in the prior art as "barrier" layers to protect chip parts during certain processes. Ti—W is metallic and will conduct electricity. A thin film of Ti—W can be applied by conventional microelectronic techniques like sputtering.

If Ti—W is used, it may be desirable to remove the Ti—W at some stage of fabrication. Several inventors have addressed the problem of removing Ti—W.

John Dion, in U.S. Pat. No. 5,130,275, teaches post-fabrication processing of semiconductor chips. His method is intended for solder joining of chips to TAB packages, where the solder is flowed rather than crushed to make the connection. Dion employs a barrier metal layer, of 10% Ti and 90% W by weight, coated over Al or gold (Au) interconnect pads 14 and a passivating layer of $SiO_2$. A Cu or Au seed layer is coated over the barrier layer. The thickness of metal over the pads is increased by electrodeposition of Cu or Au bumps into holes in a photoresist mask. Solder containing Sn is then deposited on top of the Cu or Au, and then first the seed layer and then the barrier layer are etched away to leave the built-up pads ready for soldering.

The seed layer, if of gold, is removed by chemical etching in 10% potassium cyanide. This etchant attacks the bump as well, but Dion accepts the resulting bump damage as minimal, since the bump is 25 microns thick whereas the seed layer is only 0.3 microns thick.

Dion next etches the Ti—W barrier in an aqueous solution of 30% hydrogen peroxide. (Hydrogen peroxide, or $H_2O_2$, is commercially available in 30% concentration.) He notes (column 8, line 37) that peroxide can corrode the solder bead atop the Cu/Au bump. He teaches prevention of corrosion by adjusting the pH of the solution to between 9 and 11 (basic). His preferred solution is 7% oxidized ammonium persulfate and 1% to 2% hydrogen peroxide, with the pH adjusted to between 9 and 11 by adding ammonium hydroxide. However, Dion's etchants will attack aluminum.

A 10% Ti—90% W barrier layer is also taught by James Watson in U.S. Pat. No. 5,041,191. Watson uses the Ti—W layer to prevent undesirable intermetallics that form when Au, Cu or Al contacts are deposited directly onto a thin-film resistor of nickel-chromium alloy. Watson's Ti—W etchant is 5 g of cupric sulfate ($CuSO_4$), 10 ml ammonium hydroxide ($NH_4OH$), 100 ml glycerol, and 125 ml deionized water.

This solution does not affect the nickel chromium, according to Watson. Like Dion's however, Watson's solution is alkaline and will attack aluminum.

Stephen Pyke, in U.S. Pat. No. 4,671,852, teaches an etchant composed of hydrogen peroxide, EDTA, and ammonium hydroxide for removing a thin (0.05–0.10 microns) film of 10%–30% by weight Ti and 90%–60% by weight W. Pyke's device is a chemically-sensitive SGFET structure with an internal cavity. Etchant is introduced into the cavity, which also contains a noble metal (platinum) and an aluminum oxide or silicon oxide "fugitive" layer. The etchant is intended to selectively etch the Ti—W film.

Pyke's etchant is 0.1 molar EDTA, 30% hydrogen peroxide, and concentrated ammonium hydroxide mixed in a respective volume ratio of 10:3:2. Pyke states that the pH should be less than 11 (not too basic). Pyke also teaches the use of other complexing agents besides EDTA, such as carboxylates, bipyridines, etc., but he gives no formulas or other details.

Pyke's invention, too, will attack aluminum.

U.S. Pat. No. 4,814,293, issued to Jacques Van Oekel, also teaches chemical etching of 10% Ti—90% W. He notes that hydrogen peroxide causes inhomogeneous etching, and in particular the undercutting or underetching, when Ti—W films are layered between other metals, is irregular. The agitation commonly used is ineffective in reducing the uneven results, and he advocates stagnant liquid etchants. Van Oekel buffers the peroxide solution to a pH value between 1 and 6 (acidic). His preferred buffering compounds are acetic acid and ammonium acetate. He also uses citric acid and sodium hydroxide. The etch rate is varied with the pH.

Van Oekel's solution will severely attack lead-tin (Pb—Sn) alloys such as solder, and this patent does not address selective etching of Ti—W in the presence of Pb—Sn.

Minford et al., in U.S. Pat. No. 4,554,050 teach the use of Ti etchants in fabricating waveguides. Their etchant is composed of EDTA, water, hydrogen peroxide, and ammonium hydroxide. One formula they present is 2.5 g of disodium EDTA in 100 ml of deionized water (a 0.067M solution) with 10 g hydrogen peroxide and 4.2 g ammonium hydroxide. The pH is about 10.

The etch rate is controlled by varying the OH concentration and the temperature. Minford et al. tested their solution at 20 degrees C. (room temperature) and at 60 degrees C.

Minford et al. states that their solution will etch aluminum. Moreover, their solution will attack Pb—Sn as well as aluminum.

SUMMARY OF THE INVENTION

Accordingly, the present invention relates to a chemical etchant for etching titanium-tungsten alloys in the presence of a protected metal not to be etched, the etchant comprising a mixture of between one and two parts by volume of 30% by weight aqueous hydrogen peroxide, and between one and two parts by volume water in which is dissolved between 15 and 40 grams of EDTA per liter; and between 100 and 200 grams of a salt per liter of mixture, the salt dissociating in the water to passivate the protected metal with a protective coating; whereby the protected metal is not attacked by the etchant.

DETAILED DESCRIPTION OF THE PREFERRED EMBODIMENT

Figure 1A:
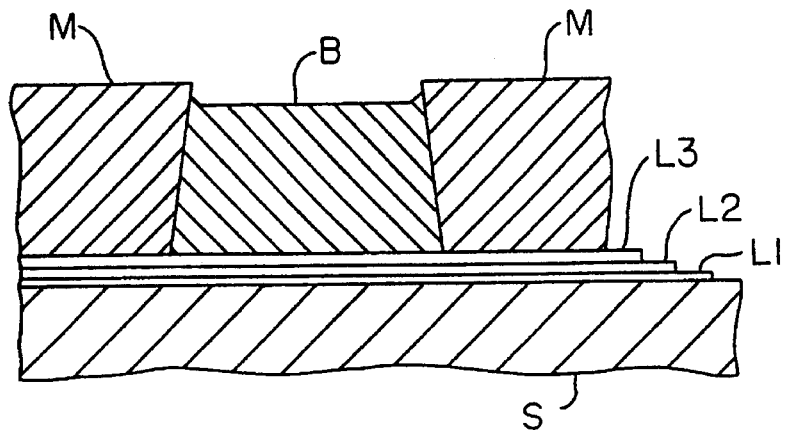
FIGS. 1A–1C are elevational, cross-sectional views of C4 solder ball formation by electroplating in accordance with the prior art.
Figure 1B:
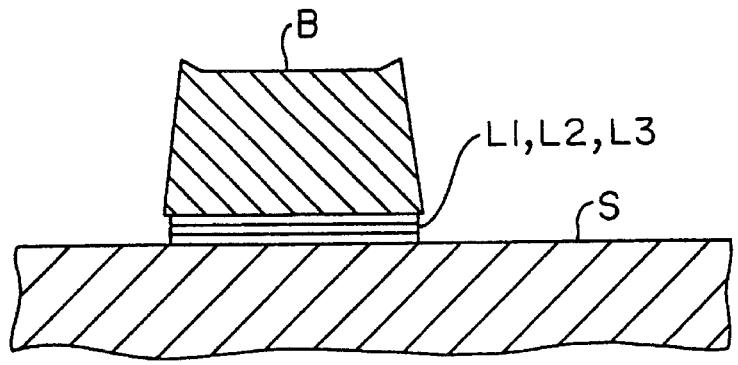
Figure 1C:
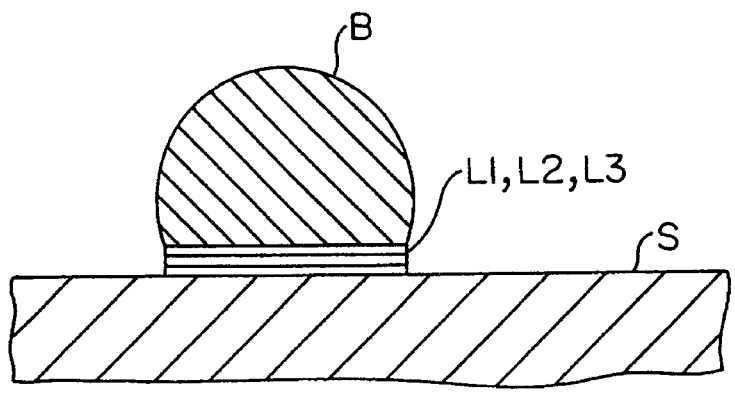

The present invention relates to a method for selectively etching Ti—W films in the presence of Pb—Sn solder, Al, Al—Cu, and phased Cr—Cu and to a chemical etchant used in the selective etching process. The method (and its corresponding etchant) was developed for C4 fabrication using electrodeposition of Pb—Sn solder bumps onto a continuous metal seed layer with a Ti—W substrate adherent layer, phased Cr—Cu layer on top of the Ti—W, and Cu as a top layer.

Copper (Cu) and aluminum (Al) are both good electrical conductors and are suitable for the seed layer. Aluminum is often used for "test" pads, pads similar to C4 pads but intended only for temporary contact with test probes when the chips are examined for defects. Copper adheres well to the lead/tin solder-ball alloy used in the invention, which might be a mixture of 97% Pb with 3% Sn. When the solder bumps are reflowed (melted) into solder balls, the tin of the solder and the copper of the seed layer form an intermetallic, $Cu_xSn_y$, under the high temperature of reflowing.

The adherence of pure copper to a silicon substrate is not strong enough for mechanical reliability of C4 balls on a copper seed layer. Experiments with phased Cr—Cu showed that the Cr adhered well to the substrates and also could be selectively etched. Thus, the first seed layer could be formed of phased Cr—Cu and the second of pure Cu. This seed layer structure was found to be strong, as the Cr—Cu adhered to the substrate and to the Cu and the Cu adhered well to the Pb—Sn of the solder bump. The Cu and Cr—Cu could be selectively etched for greater design freedom.

In the prior art chromium has been used as the bottom seed layer, as it adheres well to many substrates. However, in some cases it is desirable to selectively etch Cu and Cr—Cu layers; that is, to etch one without etching the other one. Cu and Cr—Cu layers can be differentially removed by such selective etching.

In regard to the present invention it was found that available selective Cr etchants attack Al test sites. Since many of the internal lines in a microchip are made of aluminum, it is possible that the Cr etchant used could seep into the chip through pinholes and damage the internal structure. To solve the problem an underlying coating of Ti—W barrier metal composed of 10% titanium (Ti) and 90% tungsten (W) was applied to the substrate as a preliminary seed layer. It was found that Ti—W adheres well substrate material when sputter-deposited in a vacuum chamber. Ti—W is unaffected by the Cr etchant, and protects the chip structures underneath.

Since Ti—W adheres well to both the substrate and Cr—Cu, and also resists Cr etchants, it can act as both a barrier layer and as part of the seed layer. A Ti—W coating protects Al, Au and other metals against chromium etchants. Ti—W as a barrier/seed layer thus allows greater freedom in selectively etching Cr—Cu and Cu.

However, the Ti—W must eventually be removed if it is part of the seed layer, since it is conductive and would short out the solder balls. For the Ti—W film to be useful it must be possible to selectively dissolve it without damaging structures made of other metals, such as Al or Cu test pads and Pb—Sn solder balls.

The present invention addresses the removal of Ti—W without damage to microchip structures of Pb—Sn, Al, Al—Cu, Cu, and Cr—Cu.

To develop the etching process of the invention, experimental samples were prepared and etched. The samples consisted of base wafers of Pb—Sn solder (97% lead, 3% tin). The wafers were plated with Cu 0.43 microns (4300 Å) thick, phased Cr—Cu 0.14 microns (1400 Å) thick, and Ti—W 0.10 microns (1000 Å) thick.

These films were electroetched in a neutral salt solution at potentials high enough that the Ti—W remained passive, and so was not attacked.

The first Ti—W etching process tried was a 30% by weight hydrogen peroxide ($H_2O_2$) aqueous solution at room temperature. This dissolved the Ti—W on the experimental samples, but the rate was only 15 Å per minute (about one micron per hour). The Pb—Sn was severely attacked, and at the same time plated with dissolved metal from the Ti—W layer. (Dissolution and redeposition of dissolved products is possible in a corroding system where anodic and cathodic reactions take place simultaneously.)

EDTA, a salt of ethylenediaminetetraacetic acid, was added to the solution for new experiments. Since EDTA forms a complex with tungsten (W), it in effect removes W from the solution and prevents it from plating on the Pb—Sn. The new solution contained three parts by volume of the 30% hydrogen peroxide solution and one part by volume of saturated aqueous EDTA solution (25 g of EDTA per liter of water is a saturated solution at room temperature).

In further experiments with plated Pb—Sn wafers, again at room temperature, the deposition problem was solved: the Pb—Sn remained clear of W deposits. However, the Ti—W etch rate remained low and the Pb—Sn was still attacked.

In attempting to increase the etching rate to a practical level, investigations were made into depassivation, solution agitation, and temperature effects.

Passivation is the coating of a surface with a film, such as a layer of oxide. Oxides are a particular problem with Ti, because once the oxide forms it is difficult to remove. Depassivation of Ti—W was tried by reactive ion etching (RIE) using carbon tetrafluoride ($CF_4$), by sputter etching, and by cathodic hydrogen evolution. None of these methods had any effect on the low Ti—W etching rate.

The effect of agitating the etchant liquid was also insignificant.

While depassivation and agitation failed to increase the etching rate, the effect of temperature was dramatic. The etching rate was found to increase from 22 Å per minute at 25 degrees centigrade to 462 Å per minute at 60 degrees centigrade. The dissolution rate appeared to increase roughly exponentially, and could have been increased still further but for the fact that hydrogen peroxide decomposes at a faster rate at temperatures above 60° C.

Thus, a rapid etching rate is achieved with the problem of Pb—Sn solder plating overcome. The problem of Pb—Sn attack remained. In order to solve this last problem, the concentration of hydrogen peroxide was lowered, and potassium sulphate ($K_2SO_4$) was added as a passivating agent for the Pb—Sn. $K_2SO_4$ in solution reacts with lead form a surface coating of lead sulfate.

To determine the proper concentration, various amounts of potassium sulfate were added to a mixture of: 1 part by volume of 30% by weight hydrogen peroxide; and 1 part by volume of water saturated with EDTA. It was found that the Pb—Sn attack is stopped when the solution is saturated with potassium sulfate. The etching rate of Ti—W was not affected by the potassium sulfate. It was also determined that this solution did not attack Al or Al—Cu where the Cu percentage was between 0.5% and 4.0%.

Still further experiments showed that various types of EDTA can be used in the Ti—W etchant. K-EDTA is particularly suitable for very closely-spaced C4 balls because it minimizes problems from electron migration. Na-EDTA and free acid EDTA were also found to be effective as a complexant.

Figure 2:
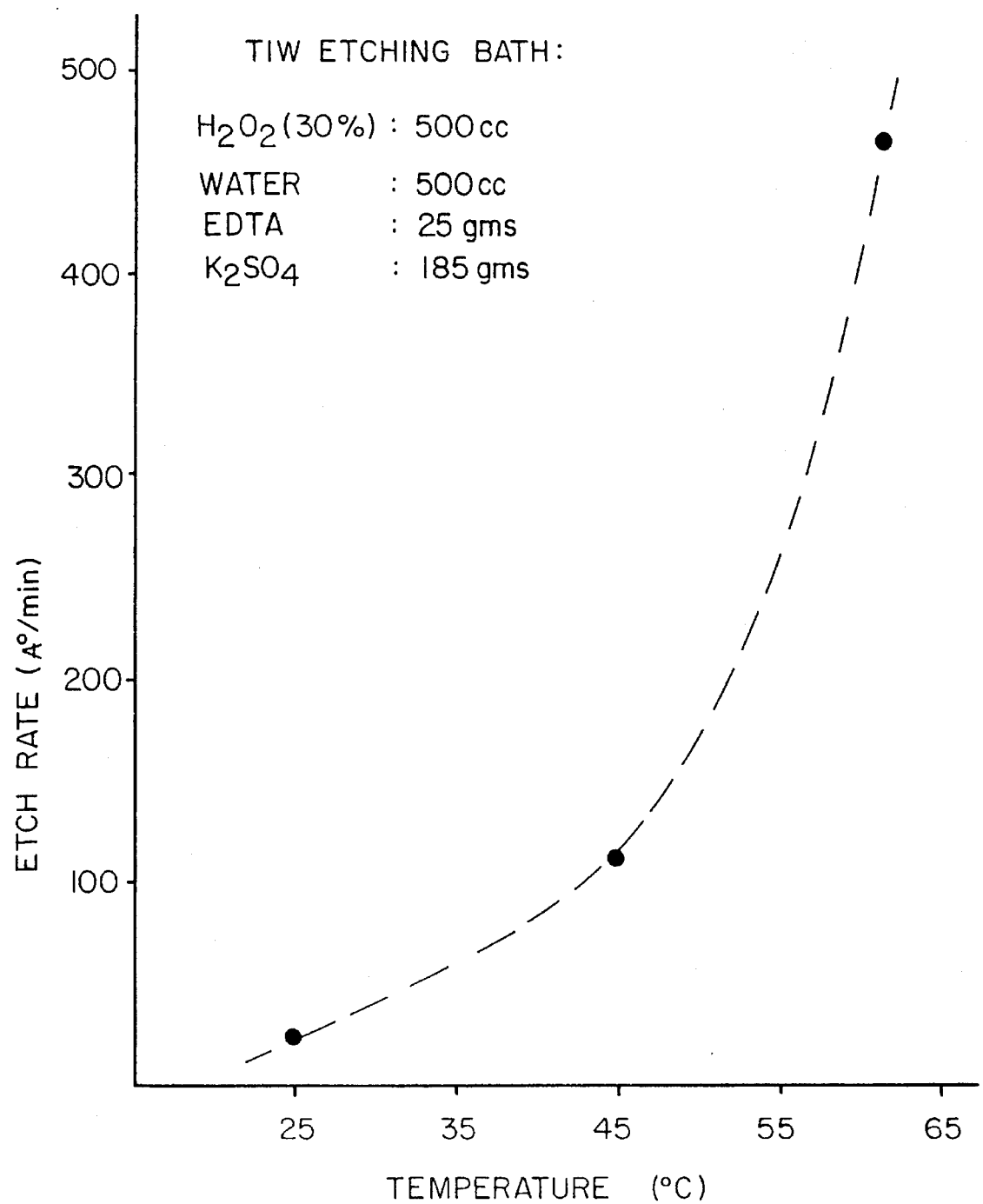
FIG. 2 is a graph showing the effect of temperature on Ti—W etchant.

In all EDTA etchants the effect of temperature is pronounced. FIG. 2 shows the effect of temperature with an etchant composed of 500 cc of 30% $H_2O_2$, 500 cc water, 25 gm EDTA, and 185 gm $K_2SO_4$. The lower axis is temperature in degrees centigrade and the vertical axis is the etching rate in Å per minute. (At 500 Å per minute the 0.10 micron-thick Ti—W seed layer of the experimental wafers would be removed in two minutes.)

The preferred etchant is a mixture of: between one and two parts by volume of 30% by weight aqueous hydrogen peroxide; and between one and two parts by volume water with between 15 and 40 g/l of EDTA dissolved in it; to which mixture is added a salt dissolved in the mixture at a concentration of between 100 and 200 g/l.

The salt is chosen to dissociate in water and passivate lead metal with a protective coating so that the lead is not attacked by the mixture. The preferred salt is potassium sulfate.

The etchant is preferably used at a temperature between 40 degrees centigrade and 60 degrees centigrade.

The etchant's pH is preferably maintained in the acidic range.

The etchant removes Ti—W at about 160 Å (0.016 microns) per minute at 50 degrees C. It does not attack Pb—Sn, Al—Cu, Cu, or phased Cr—Cu. It can be used with dip etching, which allows economical production with a simple throughput cassette-type etching process.

To test the preferred etchant, it was used to prepare C4 hardware samples. Inspection and shear tests of the finished C4 solder balls indicated that the there was no significant Pb—Sn attack and no delamination between the seed layers, the solder balls, and the substrate.

Sputtered Al and Al—Cu (the metals used in chip test pads) were immersed in the etchant for one hour at 50° C. without showing any significant etching. This shows that the etchant of the invention is safe for chips having structures, such as test pads, made of these materials.

In general, it is to be understood that the invention includes all within the scope of the following claims, and is not limited to particular examples.

What is claimed:

1. A chemical etchant for etching titanium-tungsten alloys in the presence of a protected metal not to be etched, the etchant comprising:

a mixture of between one and two parts by volume of 30% by weight aqueous hydrogen peroxide, and between one and two parts by volume of water in which is dissolved between 15 and 40 grams of EDTA per liter of the water; and between 100 and 200 grams of a salt per liter of the mixture, the salt dissociating in the mixture to passivate the protected metal with a protective coating.

2. The etchant according to claim 1, wherein the protected metal includes lead.

3. The etchant according to claim 2, wherein the protected metal includes tin.

4. The etchant according to claim 3, wherein the protected metal further comprises lead with 1% to 5% tin.

5. The etchant according to claim 2, wherein the salt is a metallic sulfate.

6. The etchant according to claim 5, wherein the salt is potassium sulfate.

7. The etchant according to claim 6, wherein the etchant is maintained at a temperature between 40 degrees centigrade and 60 degrees centigrade.

8. The etchant according to claim 1, wherein the protected metal includes aluminum.

9. The etchant according to claim 8, wherein the protected metal includes copper.

10. The etchant according to claim 8, wherein the etchant is adjusted to have a pH less than 7.0.

11. The etchant according to claim 10, wherein the etchant is maintained at a temperature between 40 degrees centigrade and 60 degrees centigrade.

12. The etchant according to claim 1, wherein the etchant is maintained at a temperature between 40 degrees centigrade and 60 degrees centigrade.

13. A method for selectively dissolving Ti—W for a device including Ti and W to be removed and a protected metal, the protected metal selected from the group consisting of Al, Al—Cu, Cr—Cu, Cu, Pb, Sn, and Pb—Sn, the method of selectively dissolving Ti—W comprising the steps of:

adding to water between 15 and 40 grams of EDTA per liter of the water to make a solution; mixing between one and two parts by volume of the solution with between one and two parts by volume 30% by weight aqueous hydrogen peroxide to make a mixture;

heating the mixture to between 40° C. and 60° C.; dissolving in the mixture a salt to an essentially saturated concentration, the salt dissociating in the water to passivate the one metal with a protective coating; and wetting the device with the mixture; so as to remove the Ti—W.

14. The method according to claim 13, wherein the salt is a metallic sulfate.

15. The method according to claim 14, wherein the salt is potassium sulfate.

16. The method according to claim 13, wherein the etchant is adjusted to have a pH less than 7.0.

17. A chemical etchant for etching titanium-tungsten alloys in the presence of a protected metal not to be etched, the etchant comprising:

a mixture maintained at an effective etching temperature, the temperature between 40 degrees C. and 60 degrees C., the mixture further comprising:

between one and two parts by volume of 30% by weight aqueous hydrogen peroxide;

between one and two parts by volume water saturated with dissolved EDTA; and between 100 and 200 grams of a salt per liter of mixture, the salt dissociating in the water to passivate the protected metal with a protective coating; whereby the protected metal is not attacked by the etchant.

18. The etchant according to claim 17, wherein the salt is a metallic sulfate.

19. The etchant according to claim 18, wherein the protected metal further comprises lead with 1% to 5% tin and the salt is potassium sulfate.

* * * * *